(12) United States Patent
Kenney

(10) Patent No.: US 6,771,482 B2
(45) Date of Patent: Aug. 3, 2004

(54) PERIMETER SEAL FOR BACKSIDE COOLING OF SUBSTRATES

(75) Inventor: Mark D. Kenney, Safety Harbor, FL (US)

(73) Assignee: Unaxis USA Inc., St. Petersburg, FL (US)

(*) Notice: Subject to any disclaimer, the term of this patent is extended or adjusted under 35 U.S.C. 154(b) by 64 days.

(21) Appl. No.: 10/163,567

(22) Filed: Jun. 6, 2002

(65) Prior Publication Data

US 2003/0021077 A1 Jan. 30, 2003

Related U.S. Application Data

(60) Provisional application No. 60/308,734, filed on Jul. 30, 2001.

(51) Int. Cl.[7] ................................................ H05F 23/00
(52) U.S. Cl. ...................... 361/234; 361/233; 361/230; 174/54 F; 174/52 F; 174/52 FP; 174/52 S; 220/66; 269/71
(58) Field of Search ................................ 361/234, 233, 361/230; 174/54 F, 52 F, 52 FP, 52 S; 220/66; 269/71

(56) References Cited

U.S. PATENT DOCUMENTS

| | | | |
|---|---|---|---|
| 3,491,789 A | | 1/1970 | Callahan, Jr. et al. |
| 3,547,401 A | | 12/1970 | Beall et al. |
| 3,739,801 A | | 6/1973 | Rudolph |
| 3,787,023 A | * | 1/1974 | Shufflebarger et al. .. 251/335.3 |
| 4,166,607 A | | 9/1979 | Webb |
| 4,201,366 A | | 5/1980 | Danko et al. |
| 4,318,529 A | | 3/1982 | Huelle et al. |
| 4,454,893 A | | 6/1984 | Orchard |
| 4,603,867 A | | 8/1986 | Babb et al. |
| 4,615,755 A | | 10/1986 | Tracy et al. |
| 4,634,099 A | | 1/1987 | Danko et al. |
| 4,687,017 A | | 8/1987 | Danko et al. |
| 4,699,137 A | | 10/1987 | Schroeder |
| 4,811,575 A | | 3/1989 | Currier et al. |
| 4,856,766 A | * | 8/1989 | Huberts ........................ 269/21 |
| 4,943,686 A | * | 7/1990 | Kucharek .................. 174/52.4 |
| 4,995,589 A | | 2/1991 | Adishian et al. |
| 5,013,400 A | | 5/1991 | Kurasaki et al. |
| 5,173,021 A | | 12/1992 | Grainger et al. |
| 5,292,399 A | | 3/1994 | Lee et al. |
| 5,326,725 A | | 7/1994 | Sherstinsky et al. |
| 5,636,098 A | * | 6/1997 | Salfelder et al. ............ 361/234 |
| 5,740,009 A | | 4/1998 | Pu et al. |
| 5,805,408 A | * | 9/1998 | Maraschin et al. ......... 361/234 |
| 5,870,271 A | * | 2/1999 | Herchen ..................... 361/234 |
| 5,885,404 A | | 3/1999 | Kim et al. |
| 6,073,576 A | | 6/2000 | Moslehi et al. |

FOREIGN PATENT DOCUMENTS

JP          4101441 A2     4/1992    ........... H01L/21/68

OTHER PUBLICATIONS

"Flared Washed Vacuum Pedestal", IBM Technical Disclosure Bulletin, Oct. 1972, p. 1621.
"Contamination Free Wafer Transfer Mechanism", IBM Technical Disclosure Bulletin, Nov. 1977, p. 2202–2203.

* cited by examiner

Primary Examiner—Anthony Dinkins
Assistant Examiner—Anton Harris
(74) Attorney, Agent, or Firm—Holland & Knight LLP

(57) ABSTRACT

An apparatus, typically a sealing member extending around the periphery of a substrate support or chuck, seals an individual substrate with respect to a substrate support, typically in a processing chamber. The seal is of a corrugated shape, that enhances clamping forces, typically from electrostatic or mechanical clamps, to provide a seal between it and the substrate, for example a wafer.

11 Claims, 5 Drawing Sheets

PERIMETER SEAL FOR BACKSIDE COOLING OF SUBSTRATES

CROSS REFERENCES TO RELATED APPLICATIONS

This application claims priority from and is related to commonly owned U.S. Provisional Patent Application Serial No. 60/308,734, filed Jul. 30, 2001, entitled: Perimeter Seal For Backside Cooling Of Substrates, this Provisional Patent Application incorporated by reference herein.

FIELD OF THE INVENTION

The present invention relates to apparatus for clamping substrates in vacuum processing chambers, and in particular, to apparatus and methods for releasably clamping the substrate to a support structure within a vacuum processing chamber, for example, in a plasma processing system.

DESCRIPTION OF THE BACKGROUND ART

Plasma processing of substrates, such as semiconductor wafers and films, is typically performed in vacuum processing chambers (vacuum chambers). Within these vacuum chambers during plasma processing, the generated plasma could potentially raise the temperature of the substrate, for example, a wafer, to a level where it becomes damaged, so as to not be usable.

To prevent thermal damage in these substrates from high temperatures, various cooling techniques and systems therefore have been developed. One such system involves conductively cooling the substrate on its "backside", the side opposite the side (front side) being plasma processed, typically by conductive cooling with Helium. This cooling technique is commonly known as "back side cooling".

Typical vacuum chambers that facilitate back side cooling have substrate support structures, commonly referred to as chucks. These chucks typically include a pattern of grooves, for maintaining helium gas passage. The flowing helium gas, or other backside gas, cools the substrate by thermal contact between the substrate and the chuck. The helium or other backside gas is typically introduced at pressures higher than the ambient pressures of the vacuum processing chambers. Accordingly, the substrates must be clamped to the chucks, to maintain the helium on the back side of the substrate and to prevent the substrate from moving, as movement will typically cause the substrate to move out of its original alignment with respect to the processing system. Once out of alignment, the substrate may be missed by an arm or other transport mechanism that picks up the substrate after plasma processing, whereby the substrate is not moved to the next processing stage and the process must be stopped for manual intervention. This results in costly down time until the process can be resumed. Alternately, the substrate may be damaged by collisions between arm members and the substrate edges, as the arm members may strike the misaligned substrate upon attempting to grasp it.

Substrates are clamped to chucks, for example, by mechanical or electrostatic clamping mechanisms. Many clamping mechanisms employ O-rings or lip-type seals, for maintaining the substrate on the chuck and sealing the substrate thereto, to prevent helium or other backside gases from leaking into the ambient (vacuum) environment of the vacuum processing chamber.

These O-ring seals exhibit several drawbacks. For example, O-rings require high compression rates for adequately sealing substrates to chucks. As a result, the substrates can be damaged upon contact with the O-rings, even before chucks are brought into contact with them, as these high pressures cause distortion in the substrates. Distortion damage stresses the substrate and can result in breakage of the substrate.

Additionally, after processing, the O-rings may adhere to the substrate. This adherence prevents the arm or transport mechanism from picking up the processed substrate, whereby the system must be stopped and manually attended to, resulting in expensive down time. Also, even slight adherence during pick up may result in damage to the substrate, whereby the substrate must be rejected as non-usable, resulting in higher costs.

There are also several drawbacks associated with lip seals. These seals tend to slide and scuff across the substrate during compression. As a result of the sliding motion, these seals generate particulates, that result in contamination of the system. This results in rejection of substrates, as well as costly downtime from decontaminating the vacuum chambers. Moreover, the lip seals may cause the substrate to be inaccurately aligned. As discussed above, this may result in the robotic arm being unable to retrieve the substrate, or damage to the substrate, if an operator can not intervene in time.

SUMMARY OF THE INVENTION

The present invention improves on the contemporary art by providing an apparatus, typically a sealing member, for clamping an individual substrate within a plasma processing chamber via an electrostatic clamp or a mechanical clamp. The sealing member provides a seal between the substrate, for example a wafer, and the substrate support, or chuck.

The sealing member is resilient, and configured to maintain substrates with low compressive forces, so as to eliminate distortion in the substrate and the potential damage associated therewith. It is also configured to release the substrate from its clamping and sealed engagement without having the substrate stick to the surface of the clamp or the substrate support.

This sealing member clamps, seals and releases the substrate from the chuck without generating any particulates. Moreover, sealing and release of the substrate by the sealing member is such that the accuracy of the alignment of the substrate is maintained, facilitating pickup and removal by a robotic arm or other transport device, free of errors and without damaging the substrate.

The sealing member of the present invention allows sufficient, yet minimal contact area between it and the substrate, preventing leakage of the process gas in the chamber by temperature control gas supplied to the back side (underside) of the substrate, and avoids particle contamination to the upper surface of the substrate.

The sealing member has a corrugated shape, with a typically "U" shaped groove therein, defining this corrugated shape. This corrugated shape provides a the sealing member with spring-like behavior, to impart linear motion to substrates, facilitating removal of these substrates from the substrate support.

An embodiment disclosed herein is directed to an apparatus for sealing of a substrate on a substrate support. The apparatus has a base portion and a seal portion in communication with the base portion, and the seal portion is configured in a corrugated shape.

Another embodiment is directed to apparatus for clamping a substrate. This apparatus includes a substrate support and a clamp coupled to the substrate support, the clamp configured for moving between a first inactive position, and a second active position, where a substrate is secured to the substrate support. Also included is a corrugated shaped seal positioned around a periphery of the substrate support, the seal configured to provide a seal between the substrate support and the substrate. The clamp can be for example, a mechanical or an electrostatic clamp.

Another embodiment is directed to an apparatus for clamping a substrate within a processing chamber, for example, a plasma processing chamber. This apparatus has a clamp (for example, electrostatic or mechanical), for holding the substrate to an upper surface of a chuck, a substrate release, and a corrugated shaped seal for sealing the substrate with respect to the chuck. The seal is configured for extending around a periphery of the chuck.

Another embodiment discloses a method of sealing a substrate on a substrate support for processing. The method includes providing a corrugated shaped seal positioned around a periphery of the substrate support, the seal including a groove defining the corrugated shape, and the groove configured such that portions of said seal move between compressed and uncompressed positions. This method also includes positioning a substrate having a peripheral edge upon the seal and clamping the substrate to the substrate support, including moving the seal to a compressed position, and maintaining a sealing engagement with the substrate. Clamping can be by either mechanical or electrostatic forces.

Another embodiment is directed to a method of mechanically clamping a substrate to a substrate support. The method comprises providing a corrugated shaped seal positioned around a periphery of the substrate support, the seal including a groove defining the corrugated shape, and the groove is configured such that portions of the seal move between compressed and uncompressed positions. The method also includes positioning a substrate having a peripheral edge upon the seal, and mechanically clamping the substrate to the substrate support. This mechanical clamping including moving the seal to a compressed position, and the seal maintaining a sealing engagement with the substrate.

Another embodiment is directed to a method of electrostatically clamping a substrate to a substrate support. The method comprises providing a corrugated shaped seal positioned around a periphery of the substrate support, the seal including a groove defining the corrugated shape, and the groove is configured such that portions of the seal move between compressed and uncompressed positions. The method also includes positioning a substrate having a peripheral edge upon the seal, and electrostatically clamping the substrate to the substrate support. This electrostatic clamping including moving the seal to a compressed position, and the seal maintaining a sealing engagement with the substrate.

Throughout this document, the terms front, back, upper, lower, upward, and downward are used. These terms are indicative of typical orientations and positions for various components and structures disclosed herein, for purposes of explanation. These terms are exemplary only.

BRIEF DESCRIPTION OF THE DRAWINGS

The invention will become more readily apparent from the following description, by way of example only, in the accompanying drawings wherein corresponding or like numerals and characters indicate corresponding or like components. In the drawings.

DETAILED DESCRIPTION OF THE PREFERRED EMBODIMENT

Figure 1:
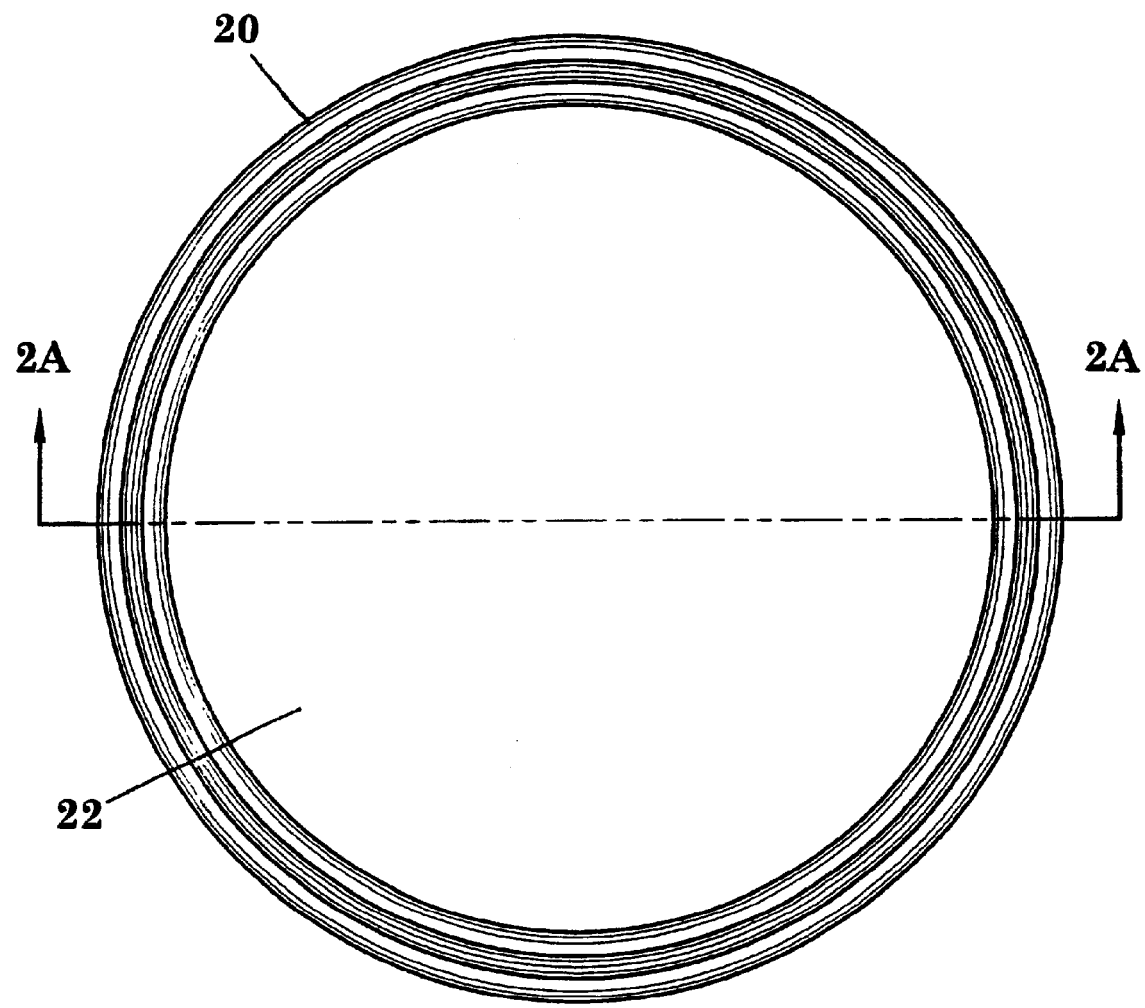
FIG. 1 is a schematic view of an embodiment of the apparatus according to the present invention.
Figure 2A:
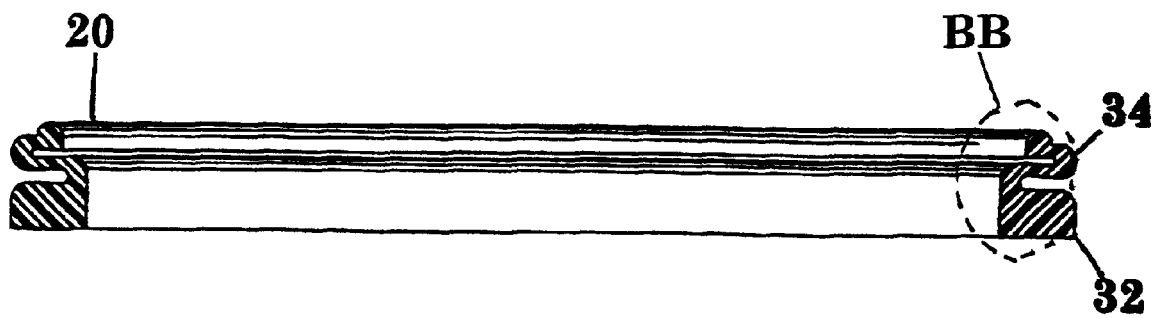
FIG. 2A is a cross-sectional view of the apparatus with the sealing member in an uncompressed position, taken along line 2A–2A of FIG. 1.
Figure 2B:
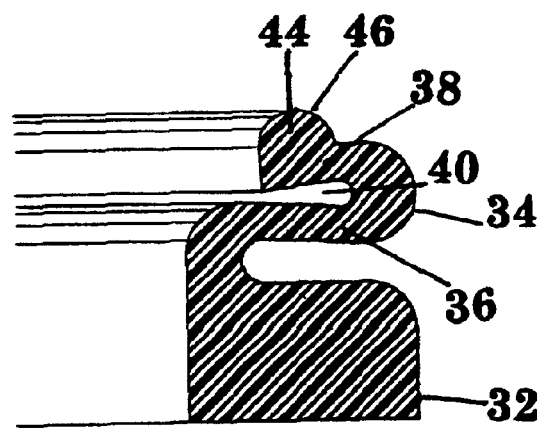
FIG. 2B is a cross-sectional view of the sealing member of circle BB of FIG. 2A in detail.

FIGS. 1, 2A and 2B show an apparatus 20 in accordance with the invention, for example, as a rounded seal, in an uncompressed position. This apparatus 20, for example, can be positioned around the periphery of a substrate support (FIGS. 5 and 6), and is typically attached thereto, in a vacuum chamber. The vacuum chamber can be, for example, a chamber that supports plasma processing of substrates, e.g., wafers, films and the like.

Accordingly, the area 22 within the apparatus 20 is suitable for accommodating cooling gas for backside cooling of substrates, at one pressure, while the area 24 outside of the apparatus 20 (within the vacuum chamber) is under vacuum. The apparatus 20 is operable with various types of clamping mechanisms for substrates, these claiming mechanisms can be for example, electrostatic or mechanical.

The apparatus 20 includes a base 32, for attaching to a substrate support or other unit, and a seal body 34 in a corrugated shape. The seal body 34 is formed of a lower arm 36 continuous with an upper arm 38. A groove 40, extends between the lower 36 and upper 38 arms, along the inner side 42 of the apparatus 20. The upper arm 38 includes a lip 44 having an edge 46.

The lower arm 36 extends inward, beyond the upper arm 38. This structure, allows the upper arm 38 to pivot with respect to the lower arm 36, when a downward force is applied to the lip 44 by a substrate.

Turning specifically to FIG. 2B, the groove 40 is typically "U" shaped, so as to provide the seal body 34, and subsequently the apparatus 20, with a corrugated shape. The groove 40 typically extends continuously along the entire periphery, here the entire circumference, with its dimensions being constant. This "U" shape can also serve as a channel for backside gases.

The edge 46 is typically rounded or radially shaped. This rounded or radially shaped edge 46 allows for rolling when the seal body 34 of the apparatus 20 moves between uncompressed and compressed states and vice versa. The rolling of the edge 46 against the substrate (backside) minimizes any sticking of the apparatus 20 to the substrate, thus avoiding potentially damaging the substrate. Additionally, the rounded or radial shape of the edge 46 creates tangential or point contacts with substrates, that minimize the amount of contacting surface areas of the edge 46 and substrate respectively.

This minimal contact facilitates rolling upon compression and decompression, and while coupled with the clamping forces of the electrostatic or mechanical clamps, maintains the sealing of the substrate and the apparatus 20, such that the backside gas, typically helium, can provide backside cooling to the substrate (remaining under pressure in the area 22), without leaking into the ambient environment 24 of the vacuum chamber. Moreover, the minimal contact of the lip 44 against the substrate back side (surface), by the seal allows the entire front side (surface) of the substrate to be processed and exposes substantially the entire back surface of the substrate to the back side gas, for enhancing thermal transfers between the substrate and the temperature regulated substrate support.

Figure 3:
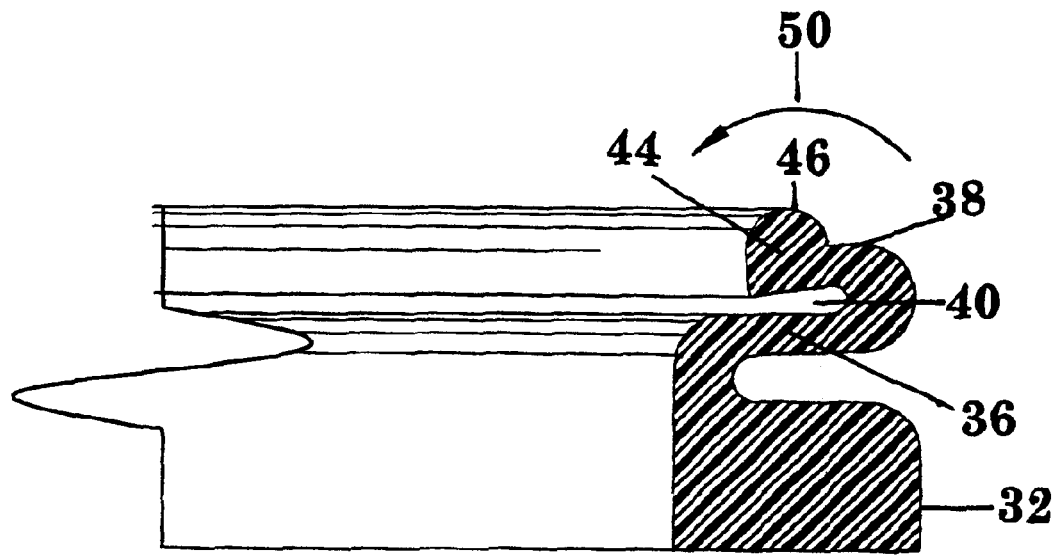
FIG. 3 is a cross sectional view of the present invention with the sealing member in a compressed position.
Figure 4:
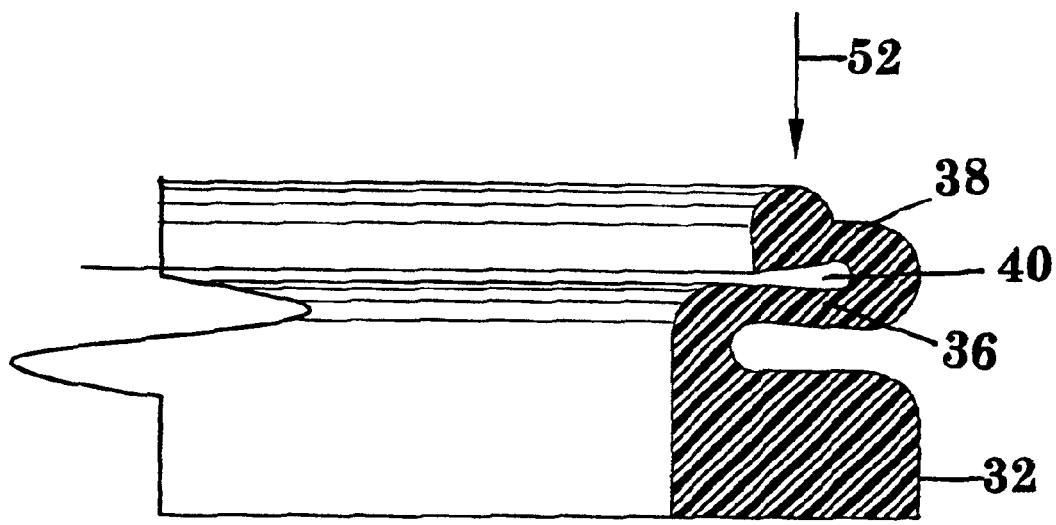
FIG. 4 is a cross sectional view of the present invention with the sealing member shown as imparting linear motion.
Figure 5:
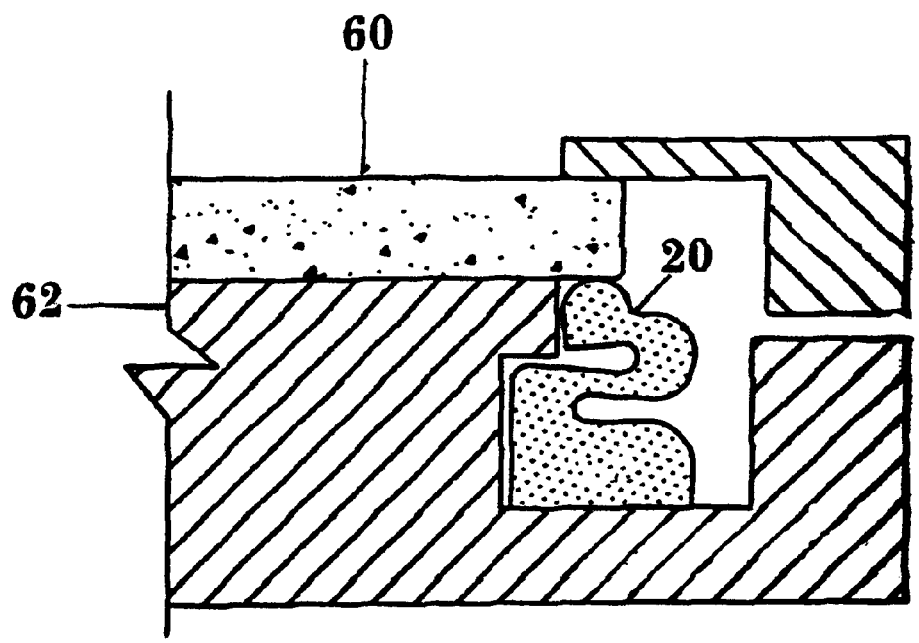
FIG. 5 is a cross sectional view of the apparatus of FIG. 1 in operation with a substrate clamped thereon.
Figure 6A:
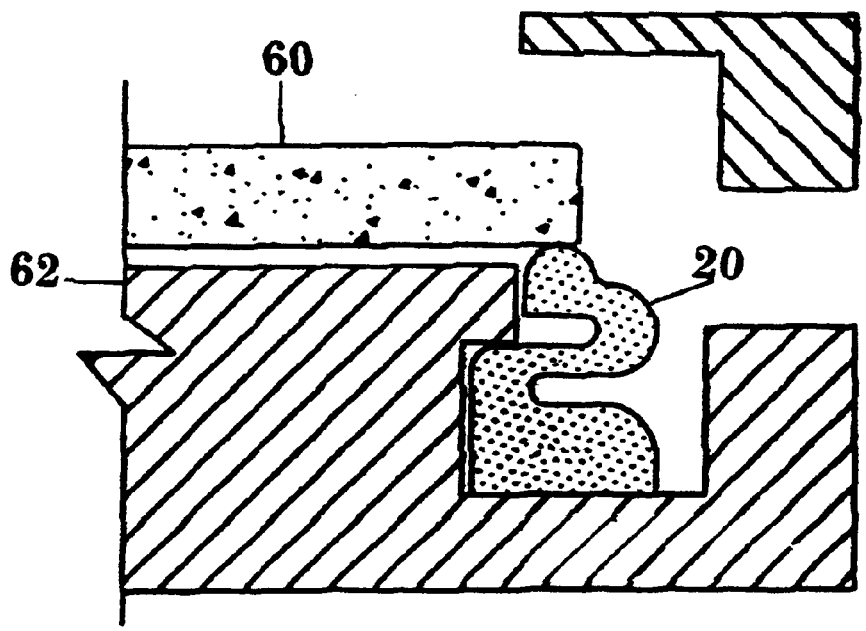
FIG. 6A is a cross sectional view of the apparatus of FIG. 1 in operation with a substrate stripped therefrom via said apparatus.
Figure 6B:
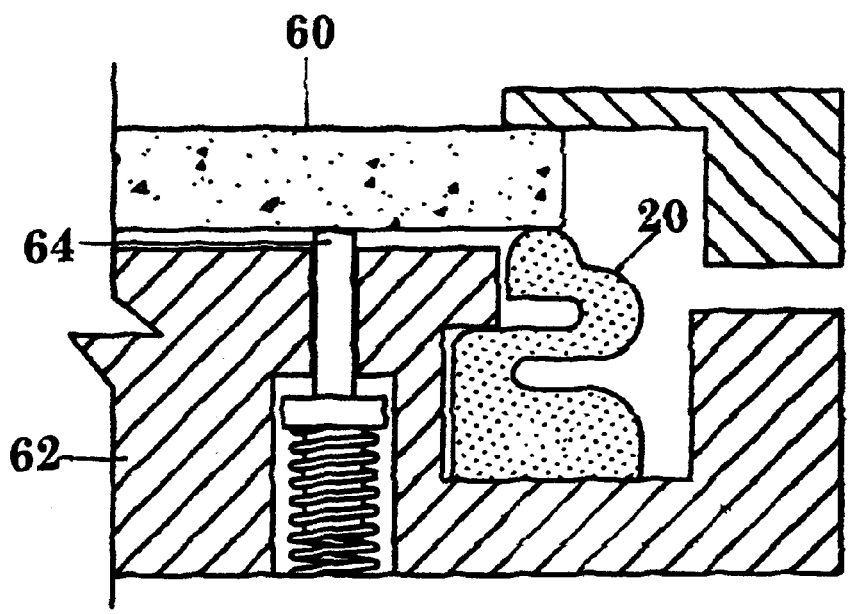
FIG. 6B is a cross sectional view of the apparatus of FIG. 1 in operation with a substrate with a compressed spring loaded stripping pin.
Figure 6C:
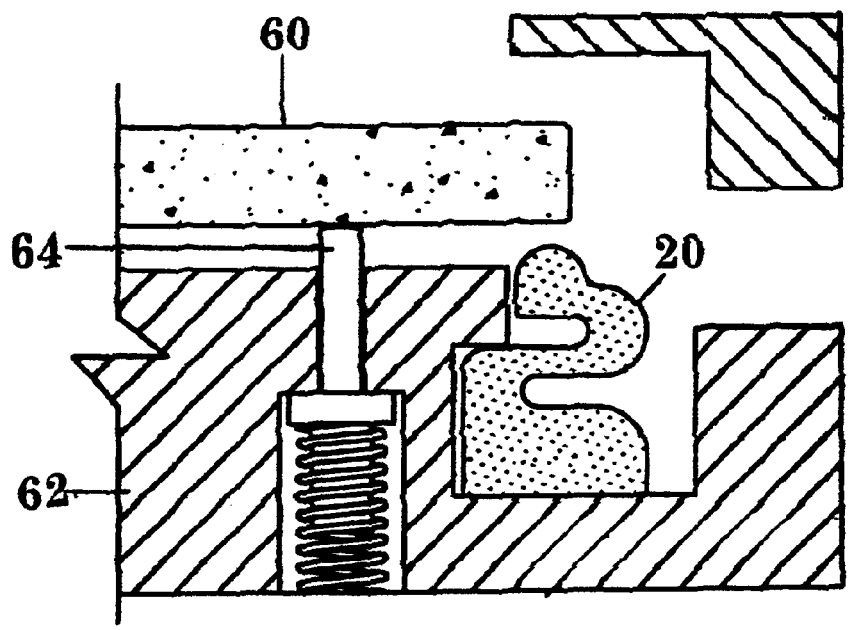
FIG. 6C is a cross sectional view of the apparatus of FIG. 1 in operation with a substrate with an uncompressed spring loaded stripping pin lifting the substrate from said apparatus.

This overall shape of the seal body 34, coupled with the material (detailed below), provide the apparatus 20 with compressive forces, upon moving from the uncompressed (or decompressed) to the compressed state (as shown in FIGS. 3–5, and described below) and spring-like behavior, upon moving from the compressed to the uncompressed states (as shown in FIGS. 2A, 2B, 6A and 6B as described below). Any of the aforementioned dimensions or materials can be changed as desired to adjust the spring rate as well as the stroke length of the apparatus 20.

The apparatus 20 is typically an integral member and a single piece. It is typically formed by molding, for example, injection molding or the like. The apparatus 20 is typically formed of hard elastomeric or polymeric materials, that are resilient and exhibit elastic behavior. For example, elastomers such as Chemraz, Kalrez, Viton can be used. However, various elastomer compositions can be employed in making the apparatus 20 in order to change the spring rate and the compression force necessary to make a seal.

The apparatus 20 is shown in a rounded peripheral shape. This is exemplary only, as the apparatus 20 can be of any peripheral shape or shapes (if there are differently shaped ends), so as to conform to the dimensions of the requisite substrate support and substrates. The actual shape is limited only by the elastomers selected and molding limits.

Turning now to FIG. 3, the rolling of the lip 44 is shown, as the seal body 34, and in particular the upper arm 38, moves from the uncompressed position to the compressed position. The compressive forces on the substrate (not shown) cause the lip 44 to roll, in the direction of the arrow 50.

Turning also to FIG. 4, movement of the lip 44 is linear throughout its range of travel, based on the geometry, and thus range of motion, of the upper arm 38. In particular, upper arm 38 pivots in response to a downward force exerted by a substrate when it is clamped. This pivoting of the upper arm 38 moves the lip 44 linearly, in the direction of arrow 52, from its orientation in the uncompressed state (shown in broken lines) to its orientation in the compressed state (and vice versa). Since this linear motion is imparted to the substrate, the accuracy of the placement of the substrate is maintained. Also, since there is linear motion, there is less likelihood that the substrate will be scuffed through any sliding motion, which reduces the risk of generating particulates.

The groove 40 is shaped to allow the backside gas to exert pressure against the upper arm 38 of the apparatus 20. This causes a downward movement of the upper arm 38, that increases the sealing forces between the apparatus 20 and a substrate. This increase in sealing forces typically occurs after the substrate has been initially clamped to the apparatus 20 (and the chuck), so as to further reduce chances for damage to the substrate.

Additionally, as shown in FIGS. 3 and 4, the upper arm 38 flexes as the apparatus 20 moves to its compressed state. This flexing motion requires minimal forces to create the seal. Since forces are minimal, there is less likely to be damage to the substrate, and moreover, the risk of the substrate adhering to the apparatus 20, is minimized.

FIG. 5 shows the apparatus 20 in a compressed or clamped position, with a substrate 60 clamped to a substrate support or chuck 62. FIG. 6A shows the apparatus 20 in an uncompressed or unclamped position. In addition, FIG. 6A shows the ability of the apparatus 20 to lift and unstick the substrate 60 from the substrate support 62, as the apparatus 20 flexes back to its original configuration upon release of clamping forces (mechanical or electrostatic). Stripping of the substrate 60 from the substrate support 62 and apparatus 20 is additionally facilitated, for example, by spring loaded stripping pins 64 as shown in 6B and 6C.

The apparatus 20 of the present invention, as noted above, can be employed with a mechanical clamping apparatus, for mechanically clamping a substrate within a plasma processing chamber. The clamping apparatus has a substrate support that is positioned within the plasma processing chamber. The substrate has an edge at its periphery. The mechanical clamp or clamping apparatus is employed to clamp the substrate, sitting on the apparatus 20, to the substrate support.

In operation, making reference to the above described drawing figures, the mechanical clamp is translatable between an extended position and a retracted position, in order to allow the substrate to be placed upon the apparatus 20 and the substrate support. The mechanical clamp securely engages the substrate at a plurality of points adjacent to the substrate edge when in its extended position for clamping the substrate to the surface of the substrate support. The apparatus 20, typically in the form of a corrugated shaped seal, is positioned around a periphery of the substrate support. When the apparatus 20 is compressed by the clamp, the apparatus 20, in particular its lip surface 46 adheres to the substrate 60, creating a seal, preventing cooling gas (backside gas) from leaking into the processing chamber. The substrate 60 can now be exposed to a plasma while being held against the chuck 62 (for example, a mechanical chuck). When the plasma treatment is complete, the mechanical clamping forces are released, the apparatus 20 decompresses, moving the substrate up linearly such that it remains properly aligned for pick up by an arm or other transport mechanism.

The apparatus 20 of the present invention, as noted above, can be employed with an electrostatic clamping apparatus, for electrostatically clamping a substrate within a plasma processing chamber, also having an electrostatic chuck. The electrostatic chuck emits an electrostatic charge to hold the substrate to an upper surface of the electrostatic chuck, with the apparatus 20, typically in the form of a corrugated shaped seal, positioned around a periphery of the electrostatic chuck and arranged to provide a seal between the electrostatic chuck and the substrate.

In an exemplary operation, a substrate is positioned on an electrostatic chuck for processing. The substrate is electrostatically engaged to the surface of the electrostatic chuck, and by electrostatic action, the substrate is sealed on the corrugated shaped seal positioned around the periphery of the electrostatic chuck. Like the seal described above, the substrate contacts the lip 44 of the upper arm 38 of the apparatus, with sufficient force to create a seal between the substrate and the lip 44, preventing gas from leaking to the vacuum ambient environment of the chamber. The substrate can now be exposed to a plasma while being held against the electrostatic chuck. When the plasma treatment is complete, the electrostatic forces are released, the apparatus 20 decompresses, moving the substrate up linearly such that it remains properly aligned for pick up by an arm or other transport mechanism.

While preferred embodiments of systems, apparatus, components and methods, have been described above, the description of the systems, apparatus, components and methods above is exemplary only. Those skilled in the art will recognize, or be able to ascertain using no more than routine experimentation, many equivalents to the specific embodiments of the invention described herein. Such equivalents are intended to be encompassed by the following claims.

Now that the invention has been described,
What is claimed is:

1. An apparatus for clamping a substrate, comprising:
   a substrate support;
   a clamp coupled to said substrate support, said clamp configured for moving between a first inactive position, and a second active position, where a substrate is secured to said substrate support;
   a corrugated shaped seal positioned around a periphery of said substrate support, said seal configured to provide a seal between the substrate support and the substrate, said seal having:
   a first arm member in communication with said base portion;
   a first "U" shaped groove intermediate said first arm member and said base portion;
   a second arm member in communication with said first arm member, said first arm extends inward beyond said second arm; and
   a second "U" shaped groove intermediate said first arm member and said second arm member, said first "U" shaped groove and said second "U" shaped groove defining said corrugated shape in said seal.

2. The apparatus of claim 1, wherein said second arm member includes at least one protrusion.

3. The apparatus of claim 1, wherein said protrusion includes at least one edge, said at least one edge in a rounded shape.

4. The apparatus of claim 1, wherein said clamp is a mechanical clamp.

5. The apparatus of claim 1, wherein said clamp is an electrostatic clamp.

6. An apparatus for clamping a substrate within a processing chamber comprising:
   a clamp configured for holding the substrate to an upper surface of a chuck;
   a substrate release; and
   a corrugated shaped seal for sealing the substrate with respect to the chuck, said seal configured for extending around a periphery of the chuck, said seal having:
   a first arm member in communication with said base portion;
   a first "U" shaped groove intermediate said first arm member and said base portion;
   a second arm member in communication with said first arm member, said first arm extends inward beyond said second arm; and
   a second "U" shaped groove intermediate said first arm member and said second arm member, said first "U" shared groove and said second "U" shaped groove defining said corrugated shape in said seal.

7. The apparatus of claim 6, wherein said second arm member includes at least one protrusion.

8. The apparatus of claim 7, wherein said protrusion includes at least one edge, said at least one edge in a rounded shape.

9. The apparatus of claim 6, wherein said clamp is a mechanical clamp and said chuck is a mechanical chuck.

10. The apparatus of claim 6, wherein said clamp is an electrostatic clamp and said chuck is an electrostatic chuck.

11. The apparatus of claim 6, wherein said substrate release include lift pins.

* * * * *